(12) United States Patent
Ramjit et al.

(10) Patent No.: US 11,384,632 B2
(45) Date of Patent: Jul. 12, 2022

(54) SYSTEM AND METHOD TO DETECT AND AVOID WELLBORE COLLISION

(71) Applicant: ConocoPhillips Company, Houston, TX (US)

(72) Inventors: Avinash Ramjit, Houston, TX (US); Paul Strohmeier, Houston, TX (US); Jonathan Rogers, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 228 days.

(21) Appl. No.: 16/437,867

(22) Filed: Jun. 11, 2019

(65) Prior Publication Data

US 2019/0376379 A1 Dec. 12, 2019

Related U.S. Application Data

(60) Provisional application No. 62/683,259, filed on Jun. 11, 2018.

(51) Int. Cl.
*E21B 47/002* (2012.01)
*E21B 47/022* (2012.01)
*B60W 30/095* (2012.01)

(52) U.S. Cl.
CPC ......... *E21B 47/022* (2013.01); *B60W 30/095* (2013.01); *E21B 47/002* (2020.05)

(58) Field of Classification Search
CPC ... E21B 47/002; E21B 47/022; B60W 30/095
See application file for complete search history.

(56) References Cited

U.S. PATENT DOCUMENTS

| 5,812,493 A | * | 9/1998 | Robein | E21B 47/02 367/25 |
| 5,901,795 A | * | 5/1999 | Tsao | E21B 43/30 175/45 |
| 7,599,797 B2 | * | 10/2009 | Poedjono | E21B 47/00 701/301 |
| 7,878,268 B2 | | 2/2011 | Chapman et al. | |
| 8,849,640 B2 | * | 9/2014 | Holl | E21B 44/00 703/10 |

(Continued)

FOREIGN PATENT DOCUMENTS

| WO | WO-2012027020 A1 | 3/2012 |
| WO | WO-2013110542 A1 | 8/2013 |
| WO | 2014201237 A1 | 12/2014 |

OTHER PUBLICATIONS

International Preliminary Report on Patentability for International Application No. PCT/US2019/036544 dated Dec. 15, 2020, 5 pages.

(Continued)

*Primary Examiner* — Michael R Wills, III
(74) *Attorney, Agent, or Firm* — Polsinelli PC

(57) ABSTRACT

A system and method are provided to detect and avoid wellbore collision. The method may include receiving, by a processor, a path of a proposed wellbore. The processor then receives a boundary surrounding the path of the proposed wellbore. The processor then generates, automatically, a list of avoidance components within the boundary using an internal database. The proposed wellbore and avoidance components in the list are then displayed by a visualization system.

20 Claims, 8 Drawing Sheets

(56) References Cited

U.S. PATENT DOCUMENTS

| | | | |
|---|---|---|---|
| 2007/0203648 A1 | 8/2007 | Poedjono et al. | |
| 2013/0140037 A1* | 6/2013 | Sequeira, Jr | E21B 7/04 |
| | | | 166/369 |
| 2014/0209300 A1* | 7/2014 | Tilke | E21B 43/017 |
| | | | 166/250.01 |
| 2014/0365192 A1* | 12/2014 | Cheng | E21B 43/30 |
| | | | 703/10 |
| 2015/0094994 A1* | 4/2015 | Sequeira, Jr | G01V 99/005 |
| | | | 703/1 |
| 2018/0038204 A1* | 2/2018 | Khan | G01V 1/282 |
| 2018/0051552 A1 | 2/2018 | Li et al. | |
| 2019/0078427 A1* | 3/2019 | Gillan | E21B 7/04 |
| 2019/0257189 A1* | 8/2019 | Bang | E21B 47/022 |

OTHER PUBLICATIONS

International Search Report and Written Opinion for International Application No. PCT/US2019/036544 dated Sep. 3, 2019, 7 pages.
Extended European Search Report for Application No. 19820005.7 dated Feb. 4, 2022 (9 pages).

* cited by examiner

SYSTEM AND METHOD TO DETECT AND AVOID WELLBORE COLLISION

CROSS-REFERENCE TO RELATED APPLICATION

This application claims the benefit of U.S. Provisional Patent Application No. 62/683,259, filed in the U.S. Patent and Trademark Office on Jun. 11, 2018, which is incorporated herein by reference in its entirety for all purposes.

BACKGROUND

1. Field of the Invention

The present inventive concept relates to a method and system to determine and drill wellbores. In particular, the present inventive concept concerns a system and method to avoid collision of avoidance components with a proposed wellbore by automatically generating a list of avoidance components within a boundary using an internal database and to drill the proposed wellbore.

2. Description of Related Art

When planning and designing a proposed wellbore, collision with avoidance components, such as pre-existing wellbores, need to be avoided. If the proposed wellbore is improperly designed, and drilling is commenced, crossing paths with an avoidance component can cause great damage and/or loss and inefficient use of resources. For example, the proposed wellbore may collide with an avoidance component that has already tapped the region of resources or create restrictions for drilling. Drilling the proposed wellbore may then be fruitless. To efficiently drill and maximize the use of resources, the proposed wellbore should be properly designed and planned to avoid crossing paths with an avoidance component.

Conventional systems and methods attempt to determine whether any avoidance components such as pre-existing wellbores may cross paths or collide with the proposed wellbore. This conventional approach is ineffective due to the inability to completely identify trajectories of pre-existing wellbores. Conventional systems and methods perform radial scans and do not provide a listing of avoidance components identified in the radial scans. Additionally, to create a listing of avoidance components, a person planning the proposed wellbore may have to obtain individual license and pay subscription fees to search and peruse regional, external databases, such as Alaska Oil and Gas Conservation Commission (AOGCC), Railroad Commission of Texas (TRCC), or DrillingInfo, which can be costly, inefficient, and yield incomplete data with inaccuracies.

Accordingly, there is a need for an improved system and method to determine collision avoidance of avoidance components with a proposed wellbore for a drilling operation.

SUMMARY

The present inventive concept provides a system and method to avoid collision of avoidance components with a proposed wellbore at the outset of a drilling operation. Avoidance components can include any restriction, structure, plan, and/or the like which may prevent and/or create issues in drilling a wellbore. Avoidance components can include, for example, pre-existing wellbores, endangered zones protecting endangered species of animals, well controls, and/or blowout wells. While the term pre-existing wellbore is used throughout the disclosure herein, the pre-existing wellbore also includes offset wellbores, injection wellbores, water wells, and any other suitable applicable well or fluidic channel which transfers fluids or gases for example fresh water, salt water, and $CO_2$. The system generally includes an internal database of avoidance components, a processor, and optionally a non-transitory storage medium and a controller. The system is operable to avoid collision or otherwise any interference of one or more avoidance components with a proposed wellbore and generate a display for visualization of a path of the proposed wellbore with avoidance components within a defined boundary. The system is also operable to begin a drilling operation and/or adjust a drilling operation upon determination whether the path of the proposed wellbore will cross a path, collide with, obstruct or be obstructed by, or otherwise adversely affect and/or be adversely affected by any of the avoidance components. The discussion throughout the disclosure of avoidance of collision or crossed paths includes avoidance of any adverse effects of avoidance components such as proximity or undesired paths of avoidance components. The method provides steps to avoid collision of avoidance components with a proposed wellbore using the system. The system of the present inventive concept advantageously automatically generates a list of avoidance components based on data using an internal database of avoidance components, thereby improving efficiency, improving accuracy, and reducing costs of the planning process. The list of avoidance components includes and highlights the avoidance components which are within a boundary and/or padding distances and may interfere or collide with the proposed wellbore. As such, the risk of collision based on proximity to the proposed wellbore can be determined.

The aforementioned may be achieved in an aspect of the present inventive concept by providing a method to plan a wellbore. The method may include receiving, by a processor, a path of a proposed wellbore. The method may also include receiving, by the processor, a boundary surrounding the path of the proposed wellbore. The method may further include generating, automatically by the processor, a list of avoidance components within the boundary based on data using an internal database. The method may further include displaying, by a visualization system, the proposed wellbores and the avoidance components from the list.

The method may further include determining, by the processor, whether any paths of the avoidance components on the list cross a path of the proposed wellbore. The method may further include receiving, by the processor, one or more padding distances. The method may also include filtering, by the processor, the list of the avoidance components within the boundary based on a distance of the avoidance components from the path of the proposed wellbore being less than or equal to the one or more padding distances.

The internal database may aggregate data of avoidance components based on data received from one or more external databases. The internal database may update daily. The avoidance components may include at least one of the following: pre-existing wellbores, water wellbores, endangered zones, well controls, and/or blowout wells. Data of the avoidance components may include at least one of the following: a surface hole location, a bottom hole location, a survey data, a depth, a width, a distance from the proposed wellbore, an area, and/or a path. The path of the proposed wellbore may be received by one or more latitude coordinates and one or more longitude coordinates. The boundary may be a rectangular area defined by a user of the system.

The aforementioned may be achieved in another aspect of the present inventive concept by providing a system configured to plan a path of a wellbore. The system may include a visualization system, an internal database of avoidance components, a processor, and a non-transitory storage medium. The non-transitory storage medium may be configured to store instructions executable by the processor. The instructions, when executed by the processor may be operable to receive a path of a proposed wellbore; receive a boundary surrounding the path of the proposed wellbore; generate, automatically, a list of the avoidance components within the boundary from the internal database; and display, by the visualization system, the proposed wellbores with the avoidance components within the boundary.

The instructions, when executed by the processor, may be further operable to determine whether any of the avoidance components in the list cross the path of the proposed wellbore. The instructions, when executed by the processor, may be further operable to receive one or more padding distances. The instructions, when executed by the processor, may be further operable to filter the list of the avoidance components within the boundary based on a distance of the avoidance components from the path of the proposed wellbore being less than or equal to the one or more padding distances.

The internal database may aggregate data of avoidance components based on data received from one or more external databases. The internal database may update daily. The avoidance components may include at least one of the following: pre-existing wellbores, water wellbores, endangered zones, well controls, and/or blowout wells. Data of the avoidance components may include at least one of the following: a surface hole location, a bottom hole location, survey data, a depth, a width, a distance from the proposed wellbore, an area, and/or a path. The path of the proposed wellbore may be received by one or more latitude coordinates and one or more longitude coordinates. The boundary may be a rectangular area defined by a user of the system.

The foregoing is intended to be illustrative and is not meant in a limiting sense. Many features of the embodiments may be employed with or without reference to other features of any of the embodiments. Additional aspects, advantages, and/or utilities of the present inventive concept will be set forth in part in the description that follows and, in part, will be apparent from the description, or may be learned by practice of the present inventive concept.

BRIEF DESCRIPTION OF THE DRAWINGS

The foregoing summary, as well as the following detailed description, will be better understood when read in conjunction with the appended drawings. For the purpose of illustration, there is shown in the drawings certain embodiments of the present disclosure. It should be understood, however, that the present inventive concept is not limited to the precise embodiments and features shown. The accompanying drawings, which are incorporated in and constitute a part of this specification, illustrate an implementation of apparatuses consistent with the present inventive concept and, together with the description, serve to explain advantages and principles consistent with the present inventive concept.

DETAILED DESCRIPTION

Figure 1:
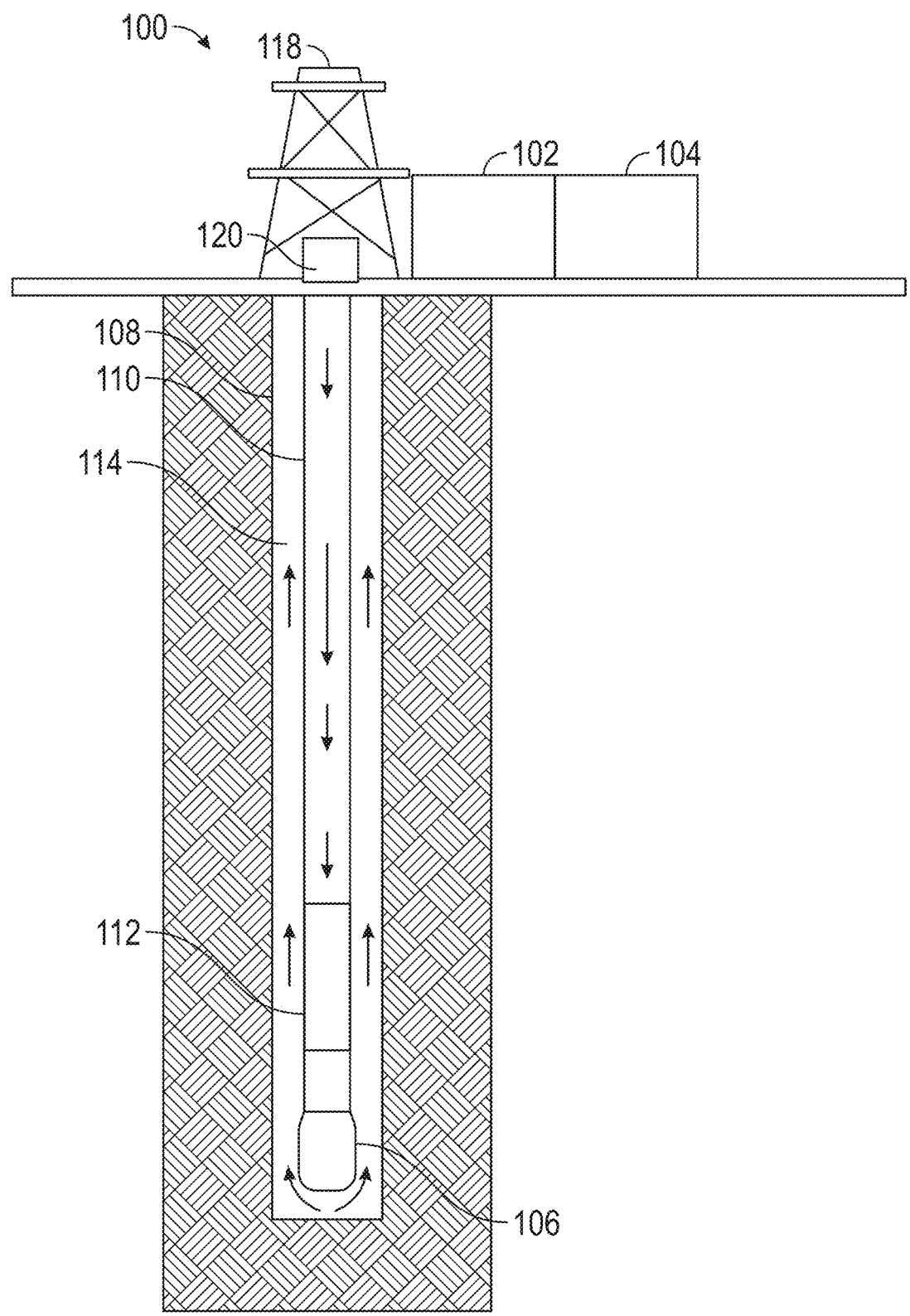
FIG. 1 is a diagram illustrating a system of the present inventive concept with a drilling rig and supporting facilities in use with a wellbore and drill string.

The following detailed description references the accompanying drawing that illustrates various embodiments of the present inventive concept. The illustration and description are intended to describe aspects and embodiments of the present inventive concept in sufficient detail to enable those skilled in the art to practice the present inventive concept. Other components can be utilized and changes can be made without deviating from the scope of the present inventive concept. The following detailed description is, therefore, not to be taken in a limiting sense. The scope of the present inventive concept is defined only by the appended claims, along with the full scope of equivalents to which such claims are entitled.

I. Terminology

The phraseology and terminology employed herein are for the purpose of description and should not be regarded as limiting. For example, the use of a singular term, such as, "a" is not intended as limiting of the number of items. Also, the use of relational terms such as, but not limited to, "top," "bottom," "left," "right," "upper," "lower," "down," "up," and "side," are used in the description for clarity in specific reference to the figures and are not intended to limit the scope of the present inventive concept or the appended claims. The term "automatic," "automatically," or any variation thereof is used in the description to describe performing a subsequent action without any assistance, interference, and/or input from a human. Further, it should be understood that any one of the features of the present inventive concept may be used separately or in combination with other features. Other systems, methods, features, and advantages of the present inventive concept will be, or become, apparent to one with skill in the art upon examination of the figures and the detailed description. It is intended that all such additional systems, methods, features, and advantages be included within this description, be within the scope of the present inventive concept, and be protected by the accompanying claims.

The present disclosure is described below with reference to operational illustrations of methods and devices. It is understood that each operational illustration and combination of operational illustrations can be implemented by means of analog or digital hardware and computer program instructions. The computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the operational illustrations or diagrams.

Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of various steps in a sample order, and are not necessarily meant to be limited to the specific order or hierarchy presented.

For the purposes of this disclosure, "program logic" refers to computer program code and/or instructions in the form of one or more software modules, such as executable code in the form of an executable application, an application programming interface (API), a subroutine, a function, a procedure, an applet, a servlet, a routine, source code, object code, a shared library/dynamic load library, or one or more instructions. These software modules may be stored in any type of a suitable non-transitory storage medium, or transitory storage medium, e.g., electrical, optical, acoustical, or other form of propagated signals such as carrier waves, infrared signals, or digital signals.

For the purposes of this disclosure, a non-transitory storage medium or computer readable medium (or computer-readable storage medium/media) stores computer data, which data can include program logic (or computer-executable instructions) that is executable by a computer, in machine readable form. By way of example, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

For purposes of this disclosure, a "wireless network" should be understood to couple devices with a network. A wireless network may employ stand-alone ad-hoc networks, mesh networks, Wireless LAN (WLAN) networks, cellular networks, or the like. A wireless network may further include a system of terminals, gateways, routers, or the like coupled by wireless radio links, or the like, which may move freely, randomly or organize themselves arbitrarily, such that network topology may change, at times even rapidly. A wireless network may further employ a plurality of network access technologies, including Long Term Evolution (LTE), WLAN, Wireless Router (WR) mesh, or 2nd, 3rd, or 4th generation (2G, 3G, or 4G) cellular technology, or the like. Network access technologies may enable wide area coverage for devices, such as client devices with varying degrees of mobility, for example.

For example, a network may enable RF or wireless type communication via one or more network access technologies, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), North American/CEPT frequencies, radio frequencies, single sideband, radiotelegraphy, radioteletype (RTTY), Bluetooth, 802.11b/g/n, or the like. A wireless network may include virtually any type of wireless communication mechanism by which signals may be communicated between devices, such as a client device or a computing device, between or within a network, or the like.

Further, as the present inventive concept is susceptible to embodiments of many different forms, it is intended that the present disclosure be considered as an example of the principles of the present inventive concept and not intended to limit the present inventive concept to the specific embodiments shown and described. Any one of the features of the present inventive concept may be used separately or in combination with any other feature. References to the terms "embodiment," "embodiments," and/or the like in the description mean that the feature and/or features being referred to are included in, at least, one aspect of the description. Separate references to the terms "embodiment," "embodiments," and/or the like in the description do not necessarily refer to the same embodiment and are also not mutually exclusive unless so stated and/or except as will be readily apparent to those skilled in the art from the description. For example, a feature, structure, process, step, action, or the like described in one embodiment may also be included in other embodiments, but is not necessarily included. Thus, the present inventive concept may include a variety of combinations and/or integrations of the embodiments described herein. Additionally, all aspects of the present disclosure, as described herein, are not essential for its practice. Likewise, other systems, methods, features, and advantages of the present inventive concept will be, or become, apparent to one with skill in the art upon examination of the figures and the description. It is intended that all such additional systems, methods, features, and advantages be included within this description, be within the scope of the present inventive concept, and be encompassed by the claims.

The term "coupled" is defined as connected, whether directly or indirectly through intervening components, and is not necessarily limited to physical connections. The connection can be such that the objects are permanently connected or releasably connected. The terms "comprising," "including" and "having" are used interchangeably in this disclosure. The terms "comprising," "including" and "having" mean to include, but not necessarily be limited to the things so described. The term "real-time" or "real time" means substantially instantaneously.

Lastly, the terms "or" and "and/or," as used herein, are to be interpreted as inclusive or meaning any one or any combination. Therefore, "A, B or C" or "A, B and/or C" mean any of the following: "A," "B" or "C"; "A and B"; "A and C"; "B and C"; "A, B and C." An exception to this definition will occur only when a combination of elements, functions, steps or acts are in some way inherently mutually exclusive.

II. General Architecture

Figure 2:
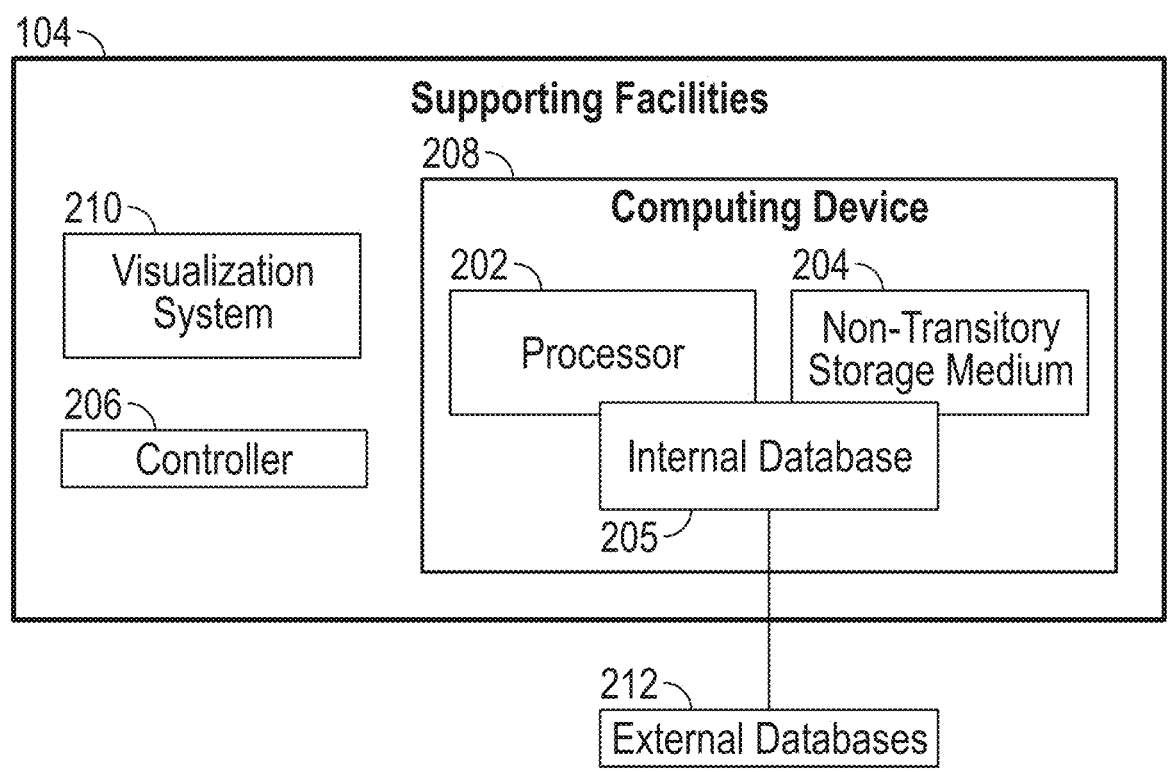
FIG. 2 is a diagram illustrating the supporting facilities of FIG. 1 having a computing device, a display, and a controller.

Turning to FIGS. 1-2, a system 100 is illustrated in use with a drilling rig 118 having a top drive motor 120 at a surface of a wellbore 108. The drilling rig 118 includes a drill string 110 extending into the wellbore 108 with one or more surface sensors 102 and supporting facilities 104 positioned at a top of the wellbore 108. The wellbore 108 extends into the ground and is formed via a drilling process using the drill string 110. A depth of the wellbore 108 can range from a few feet to over a mile into the ground and can extend in one or more directions. The drill string 110 includes a drill pipe and a bottom hole assembly (BHA) 112 positioned at a bottom of the drill string 110. The BHA 112 can include a plurality of components. In the exemplary embodiment, the BHA 112 includes a steering unit, a mud motor, a drill motor, a drill collar, and a drill bit 106. It is foreseen that the BHA 112 may include fewer or additional components without deviating from the scope of the present inventive concept. The drill string 110 extends into the wellbore 108 so that the drill bit 106 of the BHA 112 is in contact with a geological formation to crush and/or scrape the geological formation, thereby increasing a length of the wellbore 108 in a downward direction, a lateral direction, and/or any other suitable direction. In the exemplary embodiment, the drill bit 106 is driven by the top drive 120 and/or the mud motor positioned near the drill bit 106.

A drilling mud or a drilling fluid 114 can be continuously circulated within the wellbore 108 via a pump to facilitate operation of the BHA 112, e.g., drilling. The fluid 114 can be introduced into the drill string 110 via an opening of the drill string 110 and pumped down the drill string 110 via the pump. The fluid 114 exits the drill string 110 through the drill bit 106 and circulates upwards through an annulus of the wellbore 108. The fluid 114 has multiple functions including, but not limited to, cooling the drill bit 106, lubricating the drill bit 106, and/or transporting debris generated by the drill bit 106 away from the drill bit 106, e.g., up the annulus of the wellbore 108 and to the surface of the wellbore 108. The fluid 114 may be water, oil, a synthetic based composition, gas, or a combination thereof, and may include one or more additives and/or particles.

The one or more surface sensors 102 are configured to measure drilling data, for example, a surface torque of the drill string 110, and yield drilling data of the drill string torque. It is foreseen that the surface sensors 102 may be configured to measure weight on bit (WOB), lateral acceleration, rotations per minute (RPM), tension, flow rate, temperature, pressure, or any other suitable data related to the drill string 110 during drilling that can be measured from the surface without deviating from the scope of the present inventive concept. It is foreseen that the surface sensors 102 may be, or include, a strain gauge, accelerometer, gyroscope, and/or seismometer without deviating from the scope of the present inventive concept.

In the exemplary embodiment, the surface sensors 102 are positioned adjacent to the top of the drill string 110 at a surface of the wellbore 108, but it is foreseen that the surface sensors 102 can be positioned along any portion of the drill string 110 proximate to or above the surface of the wellbore 108 without deviating from the scope of the present inventive concept. For instance, it is foreseen that the surface sensors 102 can be in a sub positioned under the top drive 120 without deviating from the scope of the present inventive concept.

Turning to FIG. 2, the supporting facilities 104 include a controller 206, a computing device 208, and a visualization system 210. The visualization system 210 can be, for example, a monitor in communication with the computing device 208, a mobile device, a laptop, a television, a projector, or any suitable visualization system to display elements, such as a proposed wellbore and one or more pre-existing wellbores and/or a list of pre-existing wellbores and corresponding data, for example trajectory, depth, a surface hole location, a bottom hole location, survey data, a depth, a width, and/or a path. The visualization system 210 can also be, for example, a printer in communication with the computing device 208, which is operable to print the elements to be displayed onto any suitable display material, such as paper, glass, cardstock, and/or poster board.

The computing device 208 includes a processor 202 and a non-transitory storage medium 204. In an exemplary embodiment, the drilling data may be transmitted from the surface sensors 102 to the non-transitory storage medium 204 via a wireless connection of a wireless network, although it is foreseen that the data can be transmitted to the non-transitory storage medium 204 via a wired connection, for example a wire and/or optical fiber, without deviating from the scope of the present inventive concept. The non-transitory storage medium 204 is configured to tangibly store the data for processing by the processor 202. The computing device 208 may also include input components, such as a keyboard, a mouse, a touch screen, audio input, and/or any other suitable components to receive input from an external source. For example, a user may input data such as one or more latitude coordinates and one or more longitude coordinates into the computing device 208 through the use of a keyboard.

The computing device 208 can also include an internal database 205. In at least one example, the internal database 205 may be included in the non-transitory storage medium 204. In other examples, the internal database 205 may be a separate storage medium which tangibly stores data for processing by the processor 202. The internal database 205 may be connected, for example by a wired connection or a wireless connection, to one or more external databases 212. In at least one example, the one or more external databases 212 may be one or more online search tools which generate possible avoidance components. In at least one example, the one or more external databases 212 may provide downloadable files such that the avoidance components are available offline. For example, the one or more external databases 212 may include IHS Enerdeq, Norwegian Petroleum Directorate, the Alaska Oil and Gas Conservation Commission (AOGCC), the Railroad Commission of Texas (TRRC), Drillinginfo, the North Dakota Study Group (NDSG), Texas Water Well Database, TRRC Database of Well Controls and Blowouts, TRRC Endangered Species Database, an offshore database such as Bessie, Energy Database Exchange (ArcGIS), United States Geological Survey, US Well Data resources (UCSC), and/or any other data source which provides records for avoidance components. The internal database 205 is configured to be automatically updated with records from the one or more external databases 212 such that each of the one or more external databases 212 does not have to be individually and manually searched. Also, commercial databases are not necessary, as commercial databases perform radial scans and do not provide a listing of avoidance components. Further, individual licenses, user logins, and subscription fees from the commercial databases may be avoided. However, in at least one example, commercial databases may be utilized if desired to update the internal database 205.

The processor 202 is configured to process the data by executing program logic, which is also stored by the non-transitory storage medium 204. Using the program logic, the processor 202 is configured to avoid collision of avoidance components with a proposed wellbore. In at least one example, the processor 202 can determine which avoidance components 505, such as pre-existing wellbores 506, are of greatest risk for collision based on proximity to the proposed wellbore 502. With the avoidance components 505 of greatest risk for collision based on proximity to the proposed wellbore 502, in at least one example, the risk and/or probability of collision can be calculated.

Figure 5:
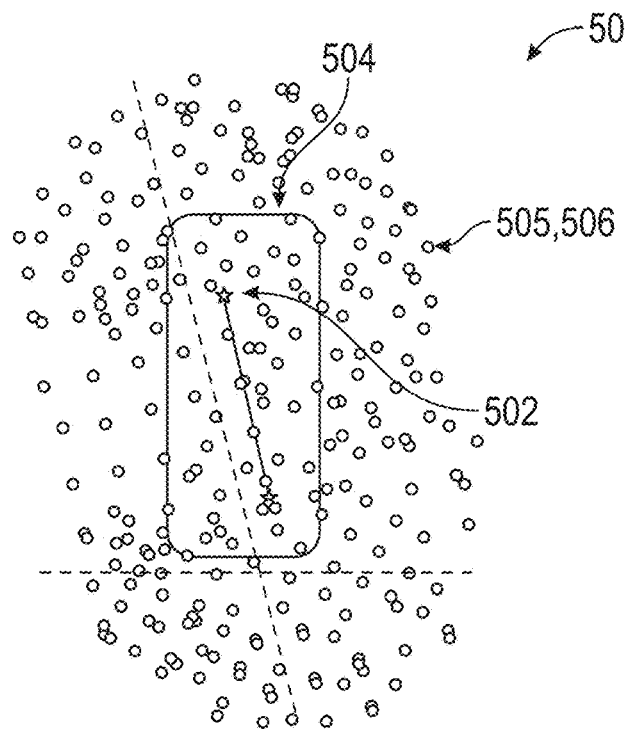
FIG. 5 is a diagram of exemplary visualization of the proposed wellbore and pre-existing wellbores.

Using the program logic, the processor 202 is also configured to receive a boundary surrounding a path of a proposed wellbore. For example, the processor 202 is configured to receive and/or display the path of the proposed wellbore 502 (as illustrated in FIG. 5) and receive and/or display a boundary 504 surrounding the proposed wellbore 502. The boundary 504 may be selectively input by a user of the system 100 as further discussed hereafter. The processor 202 is then configured to automatically generate a list of avoidance components 505 within the boundary 504 using an internal database. The processor 202 is then configured to simultaneously display, by the visualization system 210, the proposed wellbore 502 and the avoidance components 505 in the list. The processor 202 may also display, by the visualization system 210, the list of the avoidance components 505 and corresponding data related to the avoidance components 505, such as a surface hole location, a bottom hole location, survey data, a depth, a width, and/or a path. Using the program logic, the processor 202 is also configured to determine a controller setting that is effective to initiate or adjust drilling of the proposed wellbore 502 based on a determination made upon the display of the proposed wellbore 502 and the avoidance components 505. For example, the controller 206 may be operable to initiate drilling of the proposed wellbore 502 if it is determined, via the system 100, that the proposed wellbore 502 does not cross paths, collide with, or otherwise interfere with any undesired one(s) of the avoidance components 505. Also, the controller 206 may be operable to adjust a current drilling operation, such as stop drilling or adjust the path of the proposed wellbore 502 if it is determined, via the system 100, that the proposed wellbore 502 will cross paths, collide with, or otherwise interfere with any undesired one(s) of the avoidance components 505.

The controller 206 is configured to receive the controller setting from the processor 202, and modify one or more drilling parameters of the drill string 110. For example, the controller 206 can modify drilling parameters of the drill string 110 via the top drive 120. Other suitable methods of modifying drilling parameters to initiate or adjust drilling of the proposed wellbore 502 can also be utilized. Regarding the one or more drilling parameters, in the exemplary embodiment, the controller setting is converted to a rotations-per-minute (RPM) command, via the processor 202, which is effective to cause the top drive 120 to rotate the drill string 110 at a speed measured in RPMs. By adjusting the top drive 120, the drilling can be initiated, stopped, and/or adjusted by the drill string 110, via the system 100.

Figure 3:
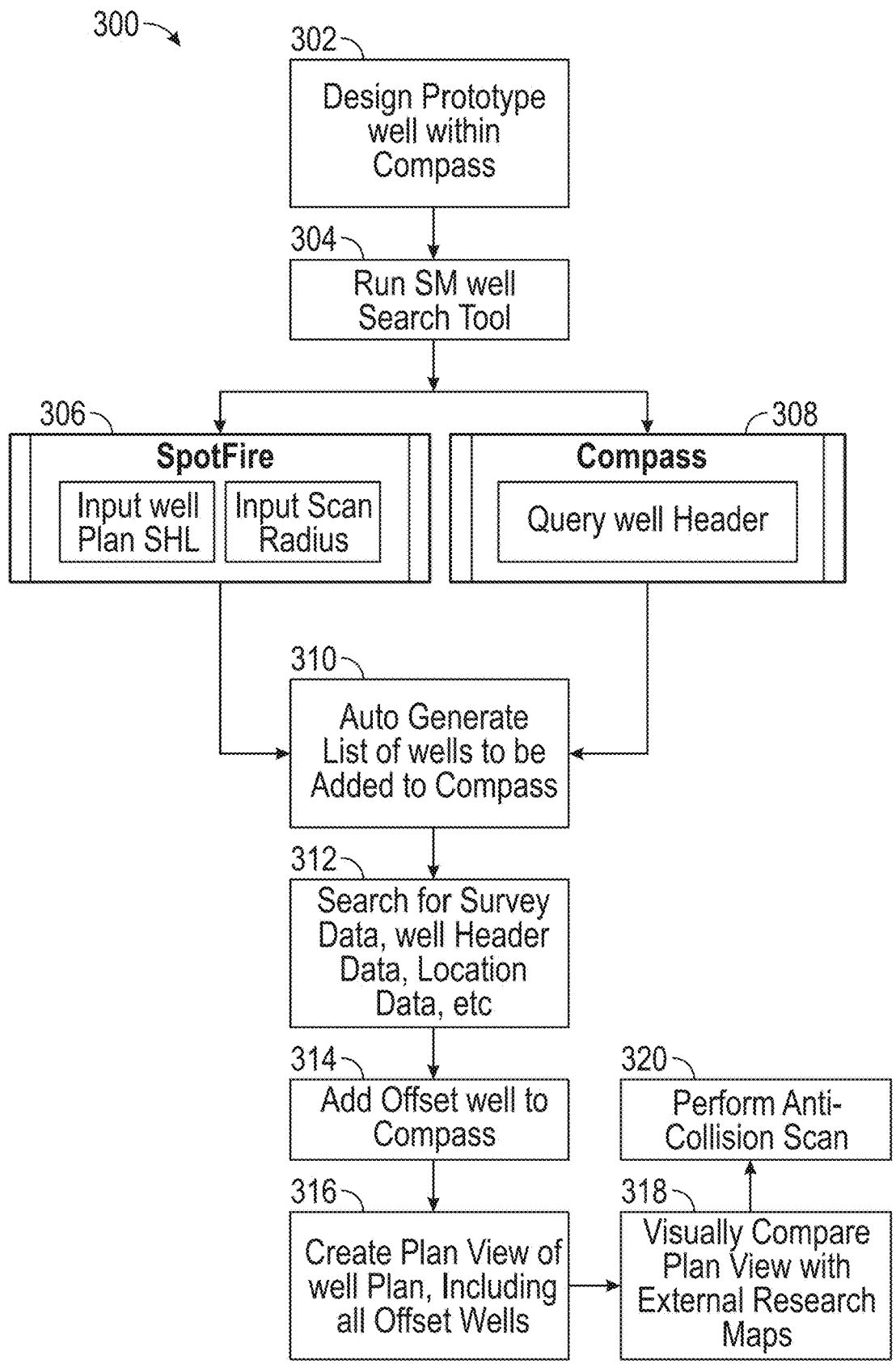
FIG. 3 is a flow chart of a method to avoid collision of pre-existing wellbores with a proposed wellbore.

Turning to FIG. 3, a flowchart is presented in accordance with an example embodiment a method 300 for determining collision avoidance of pre-existing wellbores with a proposed wellbore via the system 100. The method 300 is provided by way of example, as there are a variety of ways to carry out the method. The method 300 described herein can be carried out using the configurations and examples illustrated in FIGS. 1-2 and 5-10, for example, and various elements of these figures are referenced in explaining the method 300. Each block shown in FIG. 3 represents one or more processes, methods, or subroutines, carried out in the method 300. Furthermore, the illustrated order of blocks is illustrative only and the order of the blocks can change according to the present disclosure. Additional blocks may be added or fewer blocks may be utilized, without deviating from the scope of the present inventive concept. The method 300 can begin at block 302.

At block 302, a proposed wellbore is designed, e.g., via the user of the system 100. The proposed wellbore can be designed using one or more programs stored via the non-transitory storage medium 204, for example, COMPASS™ Directional Path Planning on a computing device such as the computing device 208 illustrated in FIG. 2.

At block 304, a wellbore search tool can be run via the computing device 208. Running the wellbore search tool can include inputting the proposed wellbore and inputting a boundary, such as a scan radius, as illustrated in block 306. The path of the proposed wellbore can be input using one or more latitude coordinates and one or more longitude coordinates. The boundary can be an incomplete shape, for example, a line or a complete shape, for example, a rectangle. The boundary can also be other shapes such as irregular shapes, circular shapes, ovoid shapes, triangular shapes, or any other suitable shapes as desired by the user of the system 100. The boundary can be set, for example, by inputting one or more latitude coordinates and one or more longitude coordinates, which correspond to corners of the boundary. For example, to calculate the Southwest and Northeast corners of a rectangular boundary:

(1) the Southwest corner latitude: (latitude of Southwest-most location of the proposed wellbore)−(180/Pi)*(boundary input/20925646);

(2) the Northeast corner latitude: (latitude of Southwest-most location of the proposed wellbore)+(180/Pi)*(boundary input/20925646);

(3) the Southwest corner longitude: (longitude of Southwest-most location of the proposed wellbore)−(180/Pi)*(boundary input/20925646)/cosine (Southwest corner latitude*Pi/180);

(4) the Northeast corner longitude: (longitude of Southwest-most location of the proposed wellbore)+(180/Pi)*(boundary input/20925646)/cosine (Northeast corner latitude*Pi/180), where 20925646 is the WGS-84 Mapping System's Equatorial Radius, in feet.

In at least one example, the boundary can be selectively drawn onto a map and/or a visualization of the proposed wellbore by the user of the system 100. For example, the visualization system 210 may display the path of the proposed wellbore, such as on a computer-generated map. The boundary may be input into the computing device 208 by the user of the system 100 by drawing a boundary around the path of the proposed wellbore using one or more input components of the system 100.

After the boundary is determined and entered into the computing device 208, the shape and/or size of the boundary may be moved or adjusted by the user of the system 100 using the one or more input components. In at least one example, adjusting the boundary may include entering one or more inputs to change the shape and/or size of the boundary into the computing device 208, thereby causing the visualization system 210 to display an updated version of the visualization of the proposed wellbore and the boundary. Also, adjusting the boundary may include selectively inputting one or more new coordinates or inputting a new boundary to replace the previously set boundary. In this manner, the boundary may also be selectively moved as desired by the user, for example, based on any determination or result generated via processing of the data via the processor 202 of the system 100.

One or more padding distances can also be input by the user via the one or more input components of the system 100. The one or more padding distances can be, for example, a number of feet, a number of meters, or other unit of measurement, to filter out avoidance components. For example, pre-existing wellbores which do not meet a number of conditions may be filtered out via the computing device 208. The conditions may include, for example: (1) having a surface hole location and/or a bottom hole location that is less than or equal to the one or more padding distances from the proposed wellbore; (2) having a surface hole location and/or a bottom location over the one or more padding distances when the total depth exceeds a minimum, a predetermined depth; and/or (3) have a total depth that exceeds a minimum, predetermined depth.

At block 308, the avoidance components can be provided by the internal database 205. With the inputs from block 306, a list of avoidance components is automatically generated at block 310. In this manner, the user is not required to manually search individual external databases and manually input avoidance components.

At block 312, data such as survey data, wellbore header data, and/or location data are searched and input. Searching for the data can occur automatically via the system 100. In at least one example, the data can be previously obtained and generated with the list at block 310.

Figure 6:
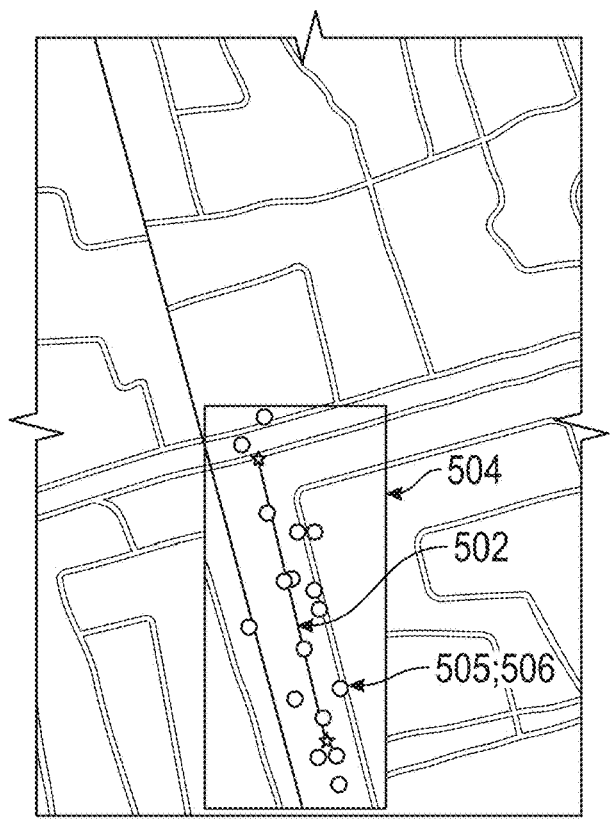
FIG. 6 is a diagram of exemplary visualization of the proposed wellbore and pre-existing wellbores within a boundary and within padding distances.
Figure 7:
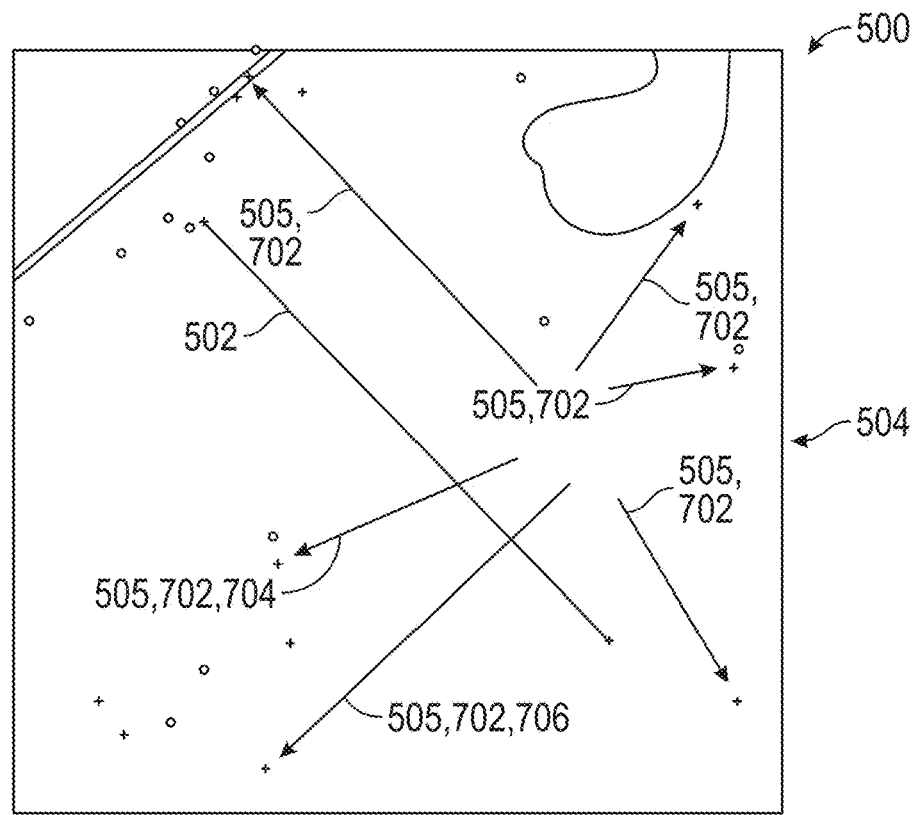
FIG. 7 is a diagram of exemplary visualization of the proposed wellbore and water water wellbores.
Figure 8:
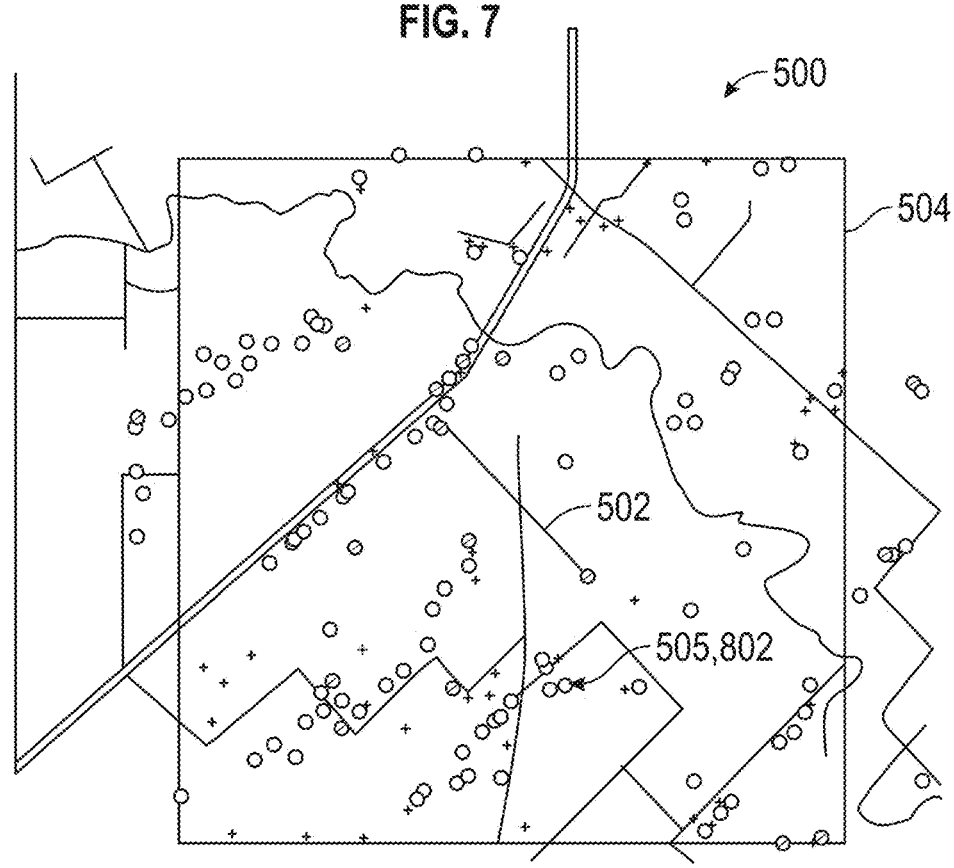
FIG. 8 is a diagram of exemplary visualization of the proposed wellbore and well control and/or blowouts.
Figure 9:
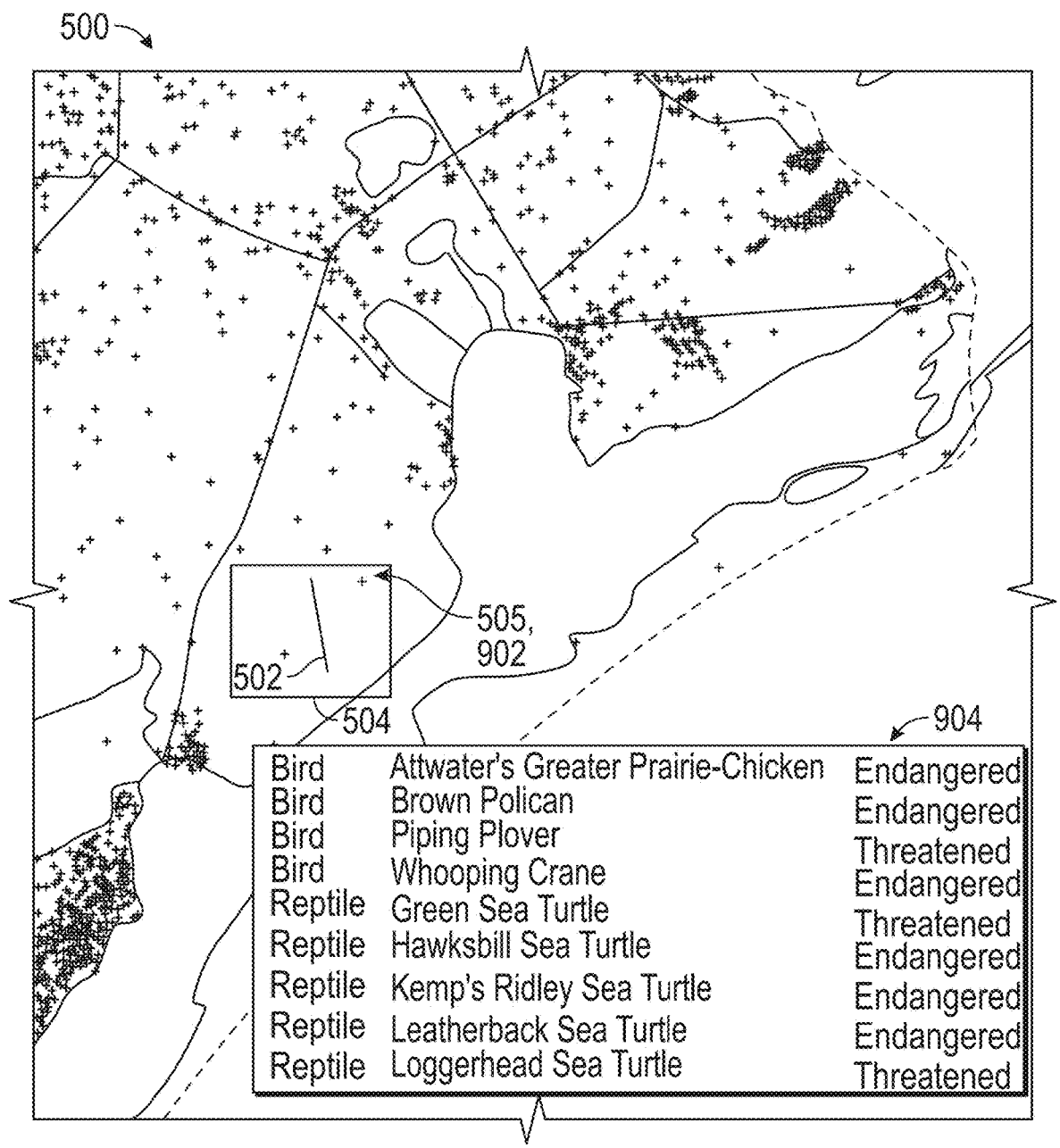
FIG. 9 is a diagram of exemplary visualization of the proposed wellbore and endangered zones.

At block 314, the pre-existing wellbores are added to the program, such as COMPASS™. At block 316, a plan view of the wellbore plan is created. The plan view or visualization can include the avoidance components from the list generated at block 310, for example as illustrated in FIGS. 5-9. FIG. 5 illustrates a visualization 500 including the proposed wellbore 502, pre-existing wellbores 506 as avoidance components 505, and the boundary 504. As shown in FIG. 5, the visualization 500 has not yet filtered out the pre-existing wellbores 506 that are not within the boundary 504 or the one or more padding distances. FIG. 6 illustrates the visualization 500, where the pre-existing wellbores 506 that are within the boundary 504 and the one or more padding distances are shown. FIG. 7 illustrates the visualization 500, where the avoidance components 505 include water wellbores 702. As illustrated in FIG. 7, two water wellbores 704, 706 may cross paths with the proposed wellbore 502, however factors such as depth may indicate that the proposed wellbore 502 would not collide with either of the water wellbores 704, 706. FIG. 8 illustrates the visualization 500, where the avoidance components 505 include well controls and/or blowout wells 802. FIG. 9 illustrates the visualization 500, where the avoidance components 505 include endangered zones 902, where an area has been restricted from disturbance as the area may inhabit and/or nest endangered animals. While FIGS. 5-9 illustrate different examples of avoidance components 505, avoidance components can include any restriction, structure, plan, and/or the like which may prevent and/or create issues in drilling a wellbore without deviating from the scope of the disclosure. At block 318, the plan view is compared with external research maps, and at block 320, an anti-collision scan is performed to determine whether any path of any of the avoidance components 505 crosses, collides with or otherwise interferes with a path of the proposed wellbore.

As previously discussed, if the proposed wellbore is approved, for example, because the path of the proposed wellbore is determined to not cross any of the paths of any avoidance components, drilling of the proposed wellbore may be initiated and/or a current drilling operation of the proposed wellbore may be adjusted. The drilling can be performed by the system 100 or a similar system. For example, the drill string 110 extends into the wellbore 108 so that the drill bit 106 of the BHA 112 is in contact with a geological formation to crush and/or scrape the geological formation, thereby increasing a length of the wellbore 108 in a downward direction, a lateral direction, and/or any other suitable direction.

Figure 4:
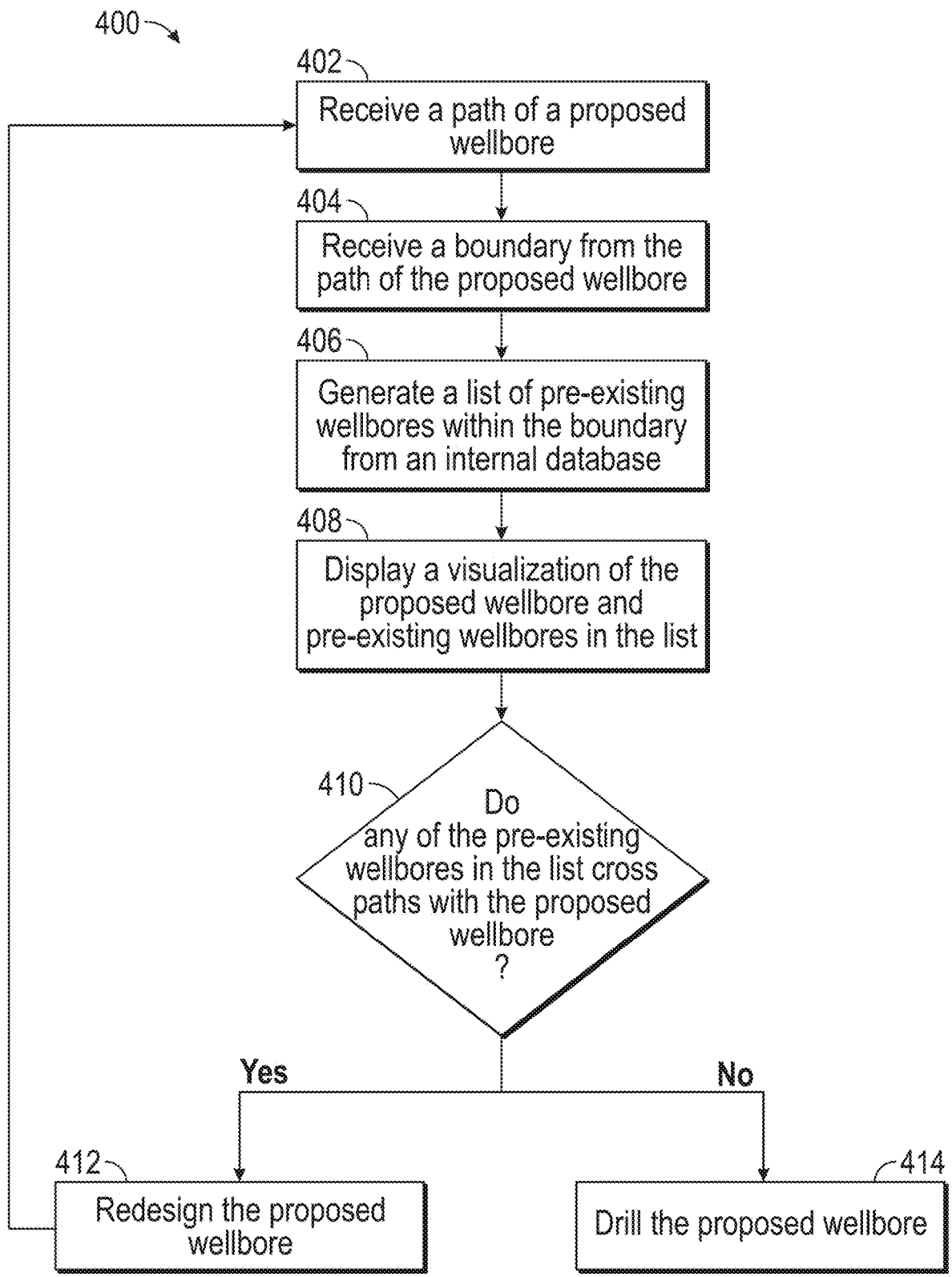
FIG. 4 is a flow chart of a method to avoid collision of pre-existing wellbores with a proposed wellbore.

Turning to FIG. 4, another flowchart is presented in accordance with an example embodiment of a method 400 for determining collision avoidance of pre-existing wellbores with a proposed wellbore via the system 100. The method 400 is provided by way of example, as there are a variety of ways to carry out the method. The method 400 described herein can be carried out using the configurations and examples illustrated in FIGS. 1-3 and 5-10, for example, and various elements of these figures are referenced in explaining the method 400. Each block shown in FIG. 4 represents one or more processes, methods, or subroutines, carried out in the method 400. Furthermore, the illustrated order of blocks is illustrative only and the order of the blocks can change according to the present disclosure. Additional blocks may be added or fewer blocks may be utilized, without deviating from the scope of the present inventive concept. The method 400 can begin at block 402.

At block 402, a path of a proposed wellbore is input into the computing device 208 via the user of the system 100 using the one or more input components of the system 100 and processed via the processor 202. The path of the proposed wellbore can be input in any suitable method. For example, the path of the proposed wellbore can be input as one or more latitude coordinates and one or more longitude coordinates. The path of the proposed wellbore can also be designed and input through programs such as COMPASS™ Directional Path Planning via the computing device 208.

At block 404, a boundary from the path of the proposed wellbore is input into the computing device 208 via the user of the system 100 using the one or more input components of the system 100 and processed via the processor 202. The boundary can be an incomplete shape, for example, a line or a complete shape, for example, a rectangle. The boundary can also be other shapes such as irregular shapes, circular shapes, ovoid shapes, triangular shapes, or any other suitable shapes as desired by the user of the system 100. The boundary can be set, for example, by inputting one or more latitude coordinates and one or more longitude coordinates, which correspond to corners of the boundary. For example, to calculate the Southwest and Northeast corners of a rectangular boundary:

(1) the Southwest corner latitude: (latitude of Southwest-most location of the proposed wellbore)−(180/Pi)*(boundary input/20925646);
(2) the Northeast corner latitude: (latitude of Southwest-most location of the proposed wellbore)+(180/Pi)*(boundary input/20925646);
(3) the Southwest corner longitude: (longitude of Southwest-most location of the proposed wellbore)−(180/Pi)*(boundary input/20925646)/cosine (Southwest corner latitude*Pi/180);

(4) the Northeast corner longitude: (longitude of Southwest-most location of the proposed wellbore)+(180/Pi)*(boundary input/20925646)/cosine (Northeast corner latitude*Pi/180), where 20925646 is the WGS-84 Mapping System's Equatorial Radius, in feet.

In at least one example, the boundary can be selectively drawn onto a map and/or a visualization of the proposed wellbore by the user of the system 100. For example, the visualization system 210 may display the path of the proposed wellbore, such as on a computer-generated map. The boundary may be input into the computing device 208 by the user of the system 100 by drawing a boundary around the path of the proposed wellbore using one or more input components of the system 100.

After the boundary is determined and entered into the computing device 208, the shape and/or size of the boundary may be moved or adjusted by the user of the system 100 using the one or more input components. In at least one example, adjusting the boundary may include entering one or more inputs to change the shape and/or size of the boundary into the computing device 208, thereby causing the visualization system 210 to display an updated version of the visualization of the proposed wellbore and the boundary. Also, adjusting the boundary may include selectively inputting one or more new coordinates or inputting a new boundary to replace the previously set boundary. In this manner, the boundary may also be selectively moved as desired by the user, for example, based on any determination or result generated via processing of the data via the processor 202 of the system 100.

At block 406, the processor 202 automatically generates a list of avoidance components within the boundary using the internal database 205. The internal database 205 aggregates data of avoidance components based on data received from the external databases 212, as previously discussed. In generating the list of avoidance components within the boundary, the processor 202 filters the avoidance components in the internal database 205 to only include the avoidance components within the boundary. In at least one example, the processor 202 may generate a list of avoidance components within a certain distance of the proposed wellbore, for example as shown in FIG. 5, before filtering the list for avoidance components within the boundary.

One or more padding distances can also be received by the user via the one or more input components of the system 100. The one or more padding distances can be, for example, a number of feet, a number of meters, or other unit of measurement, to further filter out avoidance components within the boundary. For example, avoidance components which do not meet a number of conditions may be filtered out via the computing device 208. The conditions may include, for example: (1) having a surface hole location and/or a bottom hole location that is less than or equal to the one or more padding distances from the proposed wellbore; (2) having a surface hole location or a bottom location over the one or more padding distances when the total depth exceeds a minimum, predetermined depth; (3) have a total depth that exceeds a minimum, predetermined depth; and/or (4) having an area that is restricted from disturbance. For example, as illustrated in FIG. 6, only the avoidance components which are within the boundary and within the one or more padding distances are shown.

At block 408, a visualization of the proposed wellbore and avoidance components in the list is displayed via the visualization system 210. The visualization may be, for example, the views as illustrated in FIGS. 5-9. The visualization may be, for example, printed on a medium, such as paper, or shown on a screen. Also, in at least one example, the list of the avoidance components can be displayed. The list may include data of the avoidance components such as a surface hole location, a bottom hole location, survey data, a depth, a width, a distance between one or more of the avoidance components and the proposed wellbore, an area, and/or a path. In at least one example, the list of the avoidance components can include the avoidance components which are of greatest risk for collision displayed via the visualization system 210 in an order based on proximity to the proposed wellbore and/or risk of collision. In some examples, each of the avoidance components can be selected such that the list only displays the data of the avoidance components which have been selected.

Figure 10:
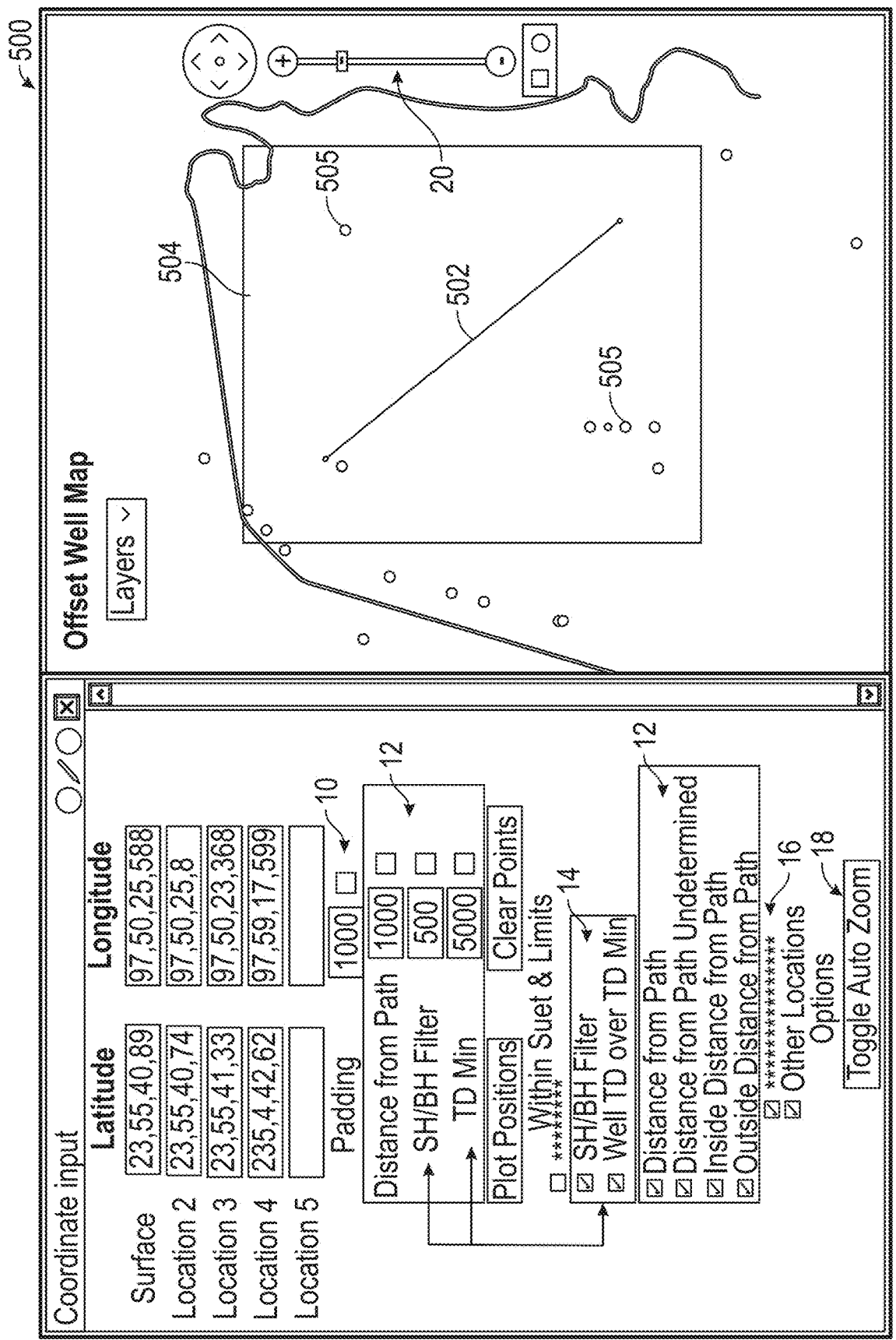
FIG. 10 is a diagram of exemplary visualization of the proposed wellbore.

In at least one example, as illustrated in FIG. 10, the visualization 500 can be adjusted and configured as desired by the user. As illustrated in FIG. 10, the visualization 500 can display the proposed wellbore 502, the boundary 504, and/or avoidance components 505. In at least one example, the padding 10 can be adjusted. The padding 10 determines the overall size of the area searched around the proposed wellbore 52. As illustrated in FIG. 10, the padding 10 is set at 1000 feet, and can be adjusted by user input. In some examples, the padding 10 can be adjusted with pre-set distance options.

The distance from path 12 determines which avoidance components 505 to display. The avoidance components 505 must be within the distance from path 12 to be displayed. As illustrated in FIG. 10, the distance from path 12 is set at 1000 feet, and can be adjusted by user input. In some examples, the distance from path 12 can be adjusted with pre-set distance options. In some examples, as illustrated in FIG. 10, the results for distance from path 12 can be further refined, for example by electing whether to consider features such as distance from path undetermined, inside distance from path, and/or outside distance from path.

The avoidance filter 14 allows a distance to be input, allowing the resultant list of avoidance components 505 to be toggled on or off depending on whether the user wants to see the avoidance components 505. For example, as illustrated in FIG. 10, the avoidance filter 14 can elect whether to show the nearest pre-existing wellbores nearest the surface hole location and/or the bottom hole location. In some examples, the user can filter out avoidance components 505 that do not meet the input minimum depth value. As illustrated in FIG. 10, the avoidance filter 14 is set at 500 feet, and can be adjusted by user input. Additionally, the minimum depth value is input as 5000 feet, and can be adjusted by user input. In some examples, the avoidance filter 14 can be adjusted with pre-set distance options.

If the resultant listing of avoidance components 505 contain abandoned locations 16, for example wellbores that may have had a permit issued but never drilled, the user can configure the visualization 500 to display or exclude the abandoned locations.

An auto zoom button 18 allows the user access to display or exclude zoom controls 20. Utilizing the zoom controls 20, the user can zoom in or out of a desired region to get a better, more detailed view of the desired region.

While FIG. 10 illustrates exemplary configurations for pre-existing wellbores, the visualization 500 can be adjusted and configured for any suitable avoidance component 505. Any combination of the above exemplary configuration options can be included without deviating from the scope of the disclosure.

At block 410, a determination is made whether any path of any of the avoidance components in the list crosses, collides with, or otherwise may interfere with the path of the proposed wellbore. With the list of avoidance components of greatest risk for collision based on proximity to the proposed wellbore, in at least one example, the risk and/or probability of collision can be calculated. The risk and/or probability of collision for each of the avoidance components can be included in the list of avoidance components. In at least one example, the risk and/or probability of collision for each of the avoidance components can be displayed and/or highlighted such that a user can assess whether to proceed with the proposed wellbore. If any path of any of the pre-existing wellbores provides a risk and/or probability of interference that is above a predetermined threshold and/or interferes with the path of the proposed wellbore, at block 412, the proposed wellbore may be redesigned, and the method may return to a prior block, e.g., block 402. When the proposed wellbore is redesigned, the path of the proposed wellbore may be adjusted to avoid one or more of the avoidance components.

If the path of the proposed wellbore does not interfere with any of the avoidance components, at block 414, drilling of the proposed wellbore is initiated via the system 100. The proposed wellbore can be drilled by system 100 as previously discussed, or any other suitable system. In at least one example, the drilling of the proposed wellbore is initiated. In other examples, the drilling of the proposed wellbore may have already been initiated, and the drilling may continue. In yet other examples, the drilling of the proposed wellbore may have already been initiated, but the proposed wellbore was redesigned after a collision was determined via the system 100. In such a case, the drilling of the proposed wellbore may stop while being redesigned, the path of the drilling may be adjusted, or any other suitable process may be performed. The drilling may, in at least one example, be automatically performed as the controller is instructed.

Such a method can prevent miscalculation, input error, or overlooked pre-existing wellbores to provide a more comprehensive and accurate list of pre-existing wellbores. Also, the list of pre-existing wellbores can provide desired information such as survey data and path of the pre-existing wellbores instead of solely location data.

It will be appreciated by those skilled in the art that changes could be made to the embodiments described above without deviating from the scope of the present inventive concept. For instance, it is foreseen that any one or more of the blocks and/or description of the method 400 of FIG. 4 and/or the method 300 of FIG. 3 may be interchangeable, omitted therefrom, and/or added thereto, without deviating from the scope of the present inventive concept. It is understood, therefore, that the present inventive concept disclosed herein is not limited to the particular embodiments disclosed, and is intended to cover modifications within the spirit and scope of the present inventive concept.

The disclosures shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A method to detect and avoid wellbore collision, the method comprising:
   receiving, by a processor, one or more latitude and longitude coordinates corresponding to a path of a proposed wellbore;
   receiving, by the processor, a boundary surrounding the path of the proposed wellbore, the boundary having a shape with at least one of one or more corners or one or more dimensions based on the one or more latitude and longitude coordinates;
   generating, automatically by the processor, a list of avoidance components within the boundary using an internal database; and
   displaying, by a visualization system, the proposed wellbore and the avoidance components in the list.

2. The method of claim 1, further comprising:
   determining, by the processor, whether any of the avoidance components in the list cross the path of the proposed wellbore.

3. The method of claim 1, further comprising:
   receiving, by the processor, one or more padding distances.

4. The method of claim 3, further comprising:
   filtering, by the processor, the list of the avoidance components within the boundary based on a distance of the avoidance components from the path of the proposed wellbore being less than or equal to the one or more padding distances.

5. The method of claim 1, wherein the internal database aggregates data of the avoidance components from one or more external databases.

6. The method of claim 1, wherein the avoidance components include at least one of the following: pre-existing wellbores, water wellbores, endangered zones, well controls, or blowout wells.

7. The method of claim 1, wherein data of the avoidance components includes at least one of the following: a surface hole location, a bottom hole location, survey data, a depth, a width, a distance from the proposed wellbore, an area, or a path.

8. The method of claim 1, wherein the boundary is a rectangular area with the one or more corners corresponding to the latitude and longitude coordinates.

9. The method of claim 1, wherein the shape is an irregular shape with the one or more dimensions based on the one or more latitude and longitude coordinates.

10. The method of claim 1, further comprising:
    receiving a boundary adjustment input; and
    changing the shape of the boundary in response to the boundary adjustment input.

11. The method of claim 10, wherein:
    the one or more latitude and longitude coordinates are first latitude and longitude coordinates;
    the boundary adjustment input includes second latitude and longitude coordinates; and
    changing the shape of the boundary includes changing the boundary to an irregular shape corresponding to the second latitude and longitude coordinates.

12. The method of claim 10, wherein receiving the boundary adjustment input includes receiving a user input at a map visualization, the user input includes a drawing which forms the boundary adjustment input.

13. A system configured to detect and avoid wellbore collision, the system comprising:
- a visualization system;
- an internal database of avoidance components;
- a processor; and
- a non-transitory storage medium configured to store instructions executable by the processor, the instructions, when executed, are operable to:
  - receive one or more latitude and longitude coordinates defining a path of a proposed wellbore;
  - receive a boundary surrounding the path of the proposed wellbore, the boundary having a shape with at least one of one or more corners or one or more dimensions based on the one or more latitude and longitude coordinates;
  - generate, automatically, a list of the avoidance components within the boundary using the internal database; and
  - display, by the visualization system, the proposed wellbore with the avoidance components within the boundary.

14. The system of claim 13, wherein the instructions, when executed by the processor, are further operable to:
- determine whether any of the avoidance components cross the path of the proposed wellbore.

15. The system of claim 13, wherein the instructions, when executed by the processor, are further operable to:
- receive one or more padding distances.

16. The system of claim 15, wherein the instructions, when executed by the processor, are further operable to:
- filter the list of the avoidance components within the boundary based on a distance of the avoidance components from the path of the proposed wellbore being less than or equal to the one or more padding distances.

17. The system of claim 13, wherein the internal database aggregates data of the avoidance components from one or more external databases.

18. The system of claim 13, wherein the avoidance components includes at least one of the following: pre-existing wellbores, water wellbores, endangered zones, well controls, or blowout wells.

19. The system of claim 13, wherein data of the avoidance components includes at least one of the following: a surface hole location, a bottom hole location, survey data, a depth, a width, a distance from the proposed wellbore, an area, or a path.

20. The system of claim 13, wherein the boundary is a rectangular area with the one or more corners defined by the one or more latitude and longitude coordinates.

* * * * *